United States Patent
Chung et al.

(10) Patent No.: US 6,860,778 B2
(45) Date of Patent: Mar. 1, 2005

(54) METHOD OF MANUFACTURING ORGANIC ELECTROLUMINESCENT ELEMENT

(75) Inventors: Chia-Tin Chung, Miaoli (TW); Mao-Jung Chung, Tainan (TW); Yao-Hui Lee, Kaohsiung (TW); Hong-Ru Guo, Tainan (TW)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/656,099

(22) Filed: Sep. 5, 2003

(65) Prior Publication Data

US 2004/0048545 A1 Mar. 11, 2004

Related U.S. Application Data

(62) Division of application No. 09/815,641, filed on Mar. 23, 2001, now Pat. No. 6,628,069.

(30) Foreign Application Priority Data

Jan. 8, 2001 (TW) .......................... 90100390 A

(51) Int. Cl.⁷ ................................. H01J 9/24
(52) U.S. Cl. .......................... 445/24; 445/25
(58) Field of Search .......................... 445/23–25, 50–51; 313/502–506

(56) References Cited

U.S. PATENT DOCUMENTS

| | | | |
|---|---|---|---|
| 5,742,129 A | * | 4/1998 | Nagayama et al. ......... 315/167 |
| 5,773,931 A | | 6/1998 | Shi et al. |
| 6,222,314 B1 | | 4/2001 | Arai et al. |
| 6,296,954 B1 | | 10/2001 | Arai et al. |
| 6,450,850 B1 | * | 9/2002 | Nunomura .................... 445/24 |

* cited by examiner

*Primary Examiner*—Joseph Williams
(74) *Attorney, Agent, or Firm*—Stroock & Stroock & Lavan LLP

(57) ABSTRACT

A structure and a method of manufacturing the organic electroluminescent (EL) elements, patterns of icons on the display panel of organic EL elements are formed. Initially, ramparts are formed on a continuous surface of a transparent and conductive film, i.e. an indium-tin oxide (ITO) film, and ramparts determine patterns of icons, then organic function layers and electrodes are formed. Processes are compatible to a conventional method of manufacturing an array type display panel, to improve disadvantages of dividing processes of array type display panels and organic EL elements into two portions.

12 Claims, 6 Drawing Sheets

METHOD OF MANUFACTURING ORGANIC ELECTROLUMINESCENT ELEMENT

CROSS-REFERENCE TO RELATED APPLICATIONS

This application is a divisional application of Application Ser. No. 09/815,641, filed on Mar. 23, 2001 now U.S. Pat. No. 6,628,069, entitled Structure and Method of Manufacturing Organic Electroluminescent Element, the contents of which are hereby incorporated by reference.

FIELD OF THE INVENTION

The present invention relates to a structure and a method of manufacturing organic electroluminescent (EL) elements. More particularly, it is related to patterns of icons of organic electroluminescent (EL) elements manufactured by ramparts.

BACKGROUND OF INVENTION

On the display panels of portable personal digital assistants and cell phones, some display information characteristics, e.g. residual owner, signal icons instead of array type display panels show intensity, call ringing and envelope. Therefore, a low-resolution problem caused by array type display panels is solved.

Referring to FIG. 1A, it is a cross-sectional view of a conventional structure using an organic EL element to form a pattern on the display panel. FIG. 1B is a top view of a first display electrode.

As shown in FIG. 1A, the organic EL element includes a first display electrode 22, i.e. an Indium-tin Oxide (ITO) film, formed on a substrate 21 which is composed of light-transparent glass. A pattern of the first electrode 22 formed by etching the ITO film is shown in FIG. 1B. An organic function layer 23, including a stacked structure of a hole injection layer, a hole transport layer, an emitting layer, an electron transport layer and an electron injection layer, and a second display electrode 24 are layered in turn on the substrate 21 and first display electrode 22. When a specific voltage is applied to the first and second display electrodes 22 and 24, a current flows through an area of the organic function layer 23 between electrodes 22 and 24, the light-emitting area of organic function layer 23 emits a corresponding pattern of an icon showed in FIG. 1B.

Such pattern of the icon, which comes from an organic EL element by utilizing the above method is defined by a first display electrode 22. However, the first display electrode 22 and the substrate 21 are made of different materials, so that their reflectivities, transmissivities and refractive indexes are not equivalent. Then, the defects of the pattern of an icon are visible from the side of the substrate 21 while no voltage is applied between these electrodes.

To improve the above disadvantages, U.S. Pat. No. 5,949,186 of Pioneer Electronic Corporation, entitled "organic electroluminescent element" (issued date, Sep. 7, 1999) shows a structure using the organic EL element to manufacture icons in a display panel.

Referring to FIG. 2A, it is a cross-sectional view of a conventional structure using the organic EL element to form a pattern on the display panel. FIG. 2B is a top view of an electron injection layer.

As shown in FIG. 2A, the organic EL element includes a first display electrode 32, i.e. an ITO film, formed on a substrate 31. An organic function layer is layered on the first display electrode 32. The organic function layer includes an electron injection layer 34 having a pattern shown in FIG. 2B, and a combined layer 33 composed of a hole injection, a hole transport layer, an emitting layer, and an electron transport layer. A second display electrode 35 is thereafter formed on the organic layers. When a specific voltage is applied to the first and second electrodes 32 and 35, a current flows through only an area of the organic function layer, which is defined by an electron injection layer 34, and the light-emitting area creates a corresponding pattern of an icon shown in FIG. 2B.

Referring to FIG. 3A, it is a cross-sectional view of a conventional structure using the organic EL element to form a pattern on the display panel. FIG. 3B is a top view of a hole injection layer.

As shown in FIG. 3A, the organic EL element includes a first display electrode 42, i.e. an ITO film, formed on substrate 41. An organic function layer is layered on the first display electrode 42. The organic function layer includes a hole injection layer 48 having a pattern shown in FIG. 3B, and a combined layer 49 composed of a hole transport layer 48, an emitting layer, an electron transport layer, and an electron injection layer. A second display electrode 40 is layered on the organic function layer. When a specific voltage is applied to the first and second electrodes 42 and 40, a current flows through only an area of the organic function layer, which is defined by the hole injection layer 48, and the light-emitting area generates a corresponding pattern of an icon shown in FIG. 3B.

Referring to FIG. 4A, it is a cross-sectional view of a structure of a conventional method using the organic EL element to form a pattern on the display panel. FIG. 4B is a top view of an electron obstruction layer.

As shown in FIG. 4A, the organic EL element includes a first display electrode 50, i.e. an ITO film, formed on substrate 59. An organic function layer 51 is layered on the first display electrode 50. An electron obstruction layer 52 having a pattern, shown in FIG. 4B, is formed on the organic function layer 51. Then, a second display electrode 53 is layered both on the organic function layer and the electron obstruction layer. When a specific voltage is applied to the first and second electrodes 50 and 53, a current flows through only an area of the organic function layer, which is not determined by the electron obstruction layer 52, and the light-emitting area produces, a corresponding pattern 57 of an icon shown in FIG. 4B.

Referring to FIG. 5A, it is a cross-sectional view of a structure of a conventional method using the organic EL element to form a pattern on the display panel. FIG. 5B is a top view of a hole obstruction layer.

As shown in FIG. 5A, the organic EL element includes a first display electrode 62, i.e. an ITO film, formed on substrate 61. A hole injection layer 67 covered with the organic function layer is layered on the first display electrode 62. A hole obstruction layer having a pattern shown in FIG. 5B is formed on the hole injection layer. Then, a combined layer 69 stacked with a hole transport layer, an emitting layer, an electron transport layer and an electron injection layer, and the second display electrode 66 are layered on the hole injection layer and the hole obstruction layer. When a specific voltage is applied to the first and second electrodes 62 and 66, a current flows through only an area of the organic functioning layer, which is not determined by the hole obstruction layer 52, and the light-emitting area brings a corresponding pattern 63 of an icon shown in FIG. 5B.

The organic EL element shown by Pioneer Electronic Corporation uses the ITO film as the continuous surface.

However, during the process of manufacturing patterns on an electron injection layer, a hole injection layer, an electron obstruction layer or hole obstruction layer, the formation of patterns is utilizing metal mask process for evaporation that increase the complex as well as the disadvantages of pollution and vulnerable pattern control. In addition, the metal mask processes are not compatible with the conventional method of manufacturing an array type display panel. So the processes of the array type display panel and the organic EL element must be divided, and it increases the complexity of manufacturing the display panel.

SUMMARY OF THE INVENTION

One aspect of the present invention is to provide a structure and a method of manufacturing an organic EL element. Initially, a rampart is formed on the ITO film with continuous surface, to define a pattern of an icon. The organic function layer and electrodes are then formed.

The present invention is also provides a structure and a method of manufacturing an organic EL element. The rampart of the present invention is used to separate the organic function layer and the second display electrode so as to, avoid the additional metal mask process on the organic function layer or the second display electrode for pattern formation, and to further reduce the cost of evaporation process.

Another aspect of the present invention is to provide a structure and a method of manufacturing an organic EL element. The process of the present invention is compatible with the conventional method; therefore, the disadvantage of separate the process requirement on the array type display panel and the organic EL element can be resolved.

According to the above aspects, the present invention provides a method of manufacturing an organic EL element to form a pattern on a display panel. It includes the following steps: providing a substrate, forming a first display electrode having a continuous surface on the substrate, forming a rampart such that a specific portion identical with the pattern of the first display electrode is exposed, and forming the organic function layer and the second display electrode in turn on the rampart and the exposed portion of the first display electrode.

According to the above aspects, the present invention provides a structure of an organic EL element. The pattern formation on a display panel, includes a first display electrode having a continuous surface on the substrate, a rampart for exposing a portion of the first display electrode, wherein the exposed portion of the first display is the same as the pattern, an organic function layer having the same pattern located on the exposed portion of the first display electrode, and a second display electrode having the same pattern on the organic function layer.

BRIEF DESCRIPTION OF THE DRAWINGS

The foregoing aspects and many of the attendant advantages of this invention will become more readily appreciated as it becomes better understood by reference to the following detailed description, when taken in conjunction with the accompanying drawings, wherein.

DETAILED DESCRIPTION OF THE PREFERRED EMBODIMENT

Figure 1A:
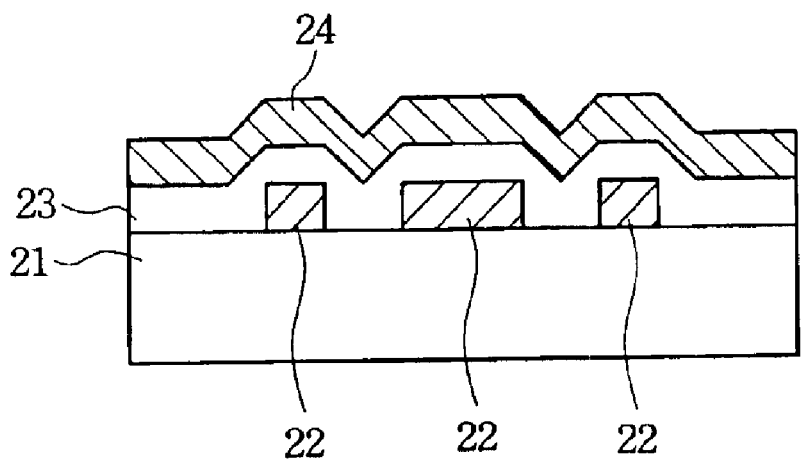
FIG. 1A is a cross-sectional view of a structure of conventional method of using the organic EL element to form a pattern on the display panel.
Figure 1B:
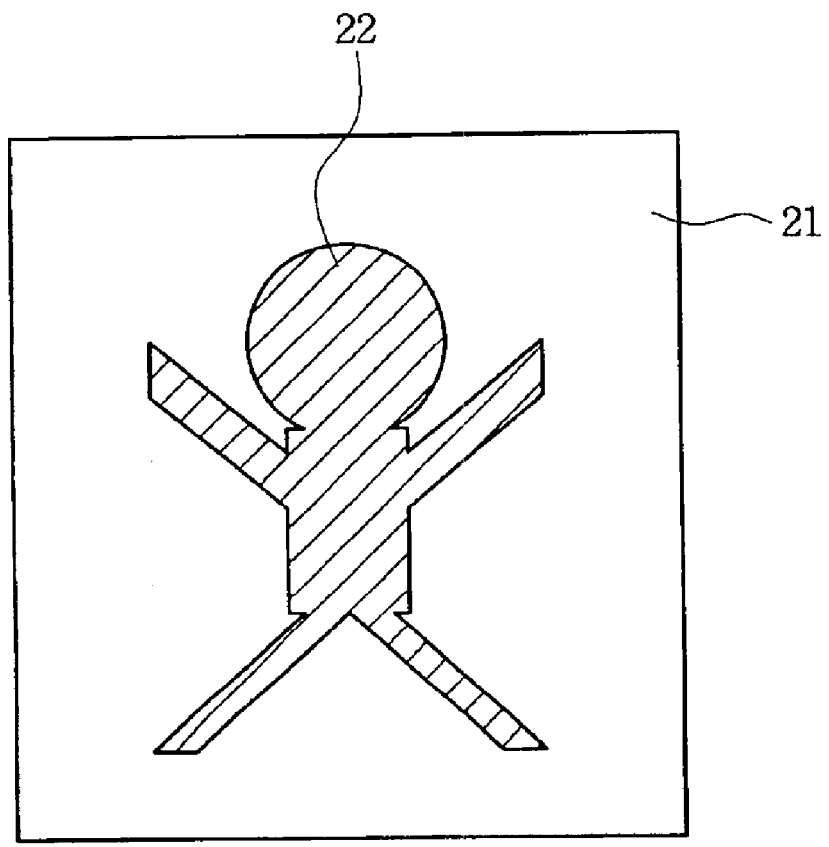
FIG. 1B is a top view of a first display electrode.
Figure 2A:
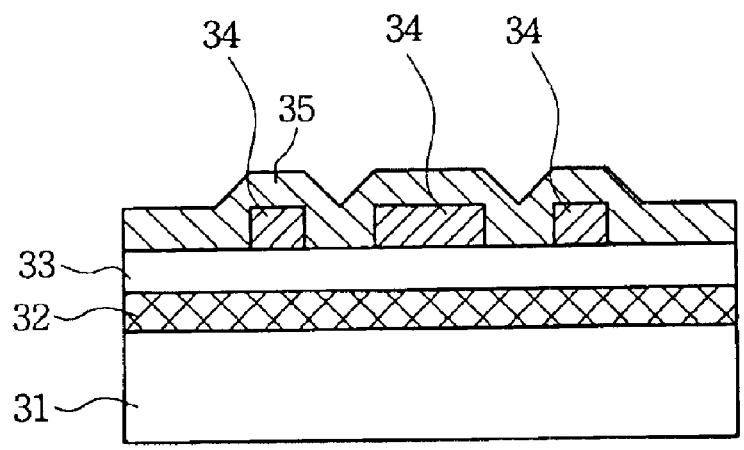
FIG. 2A is a cross-sectional view of a structure of conventional method using the organic EL element to form a pattern on the display panel.
Figure 2B:
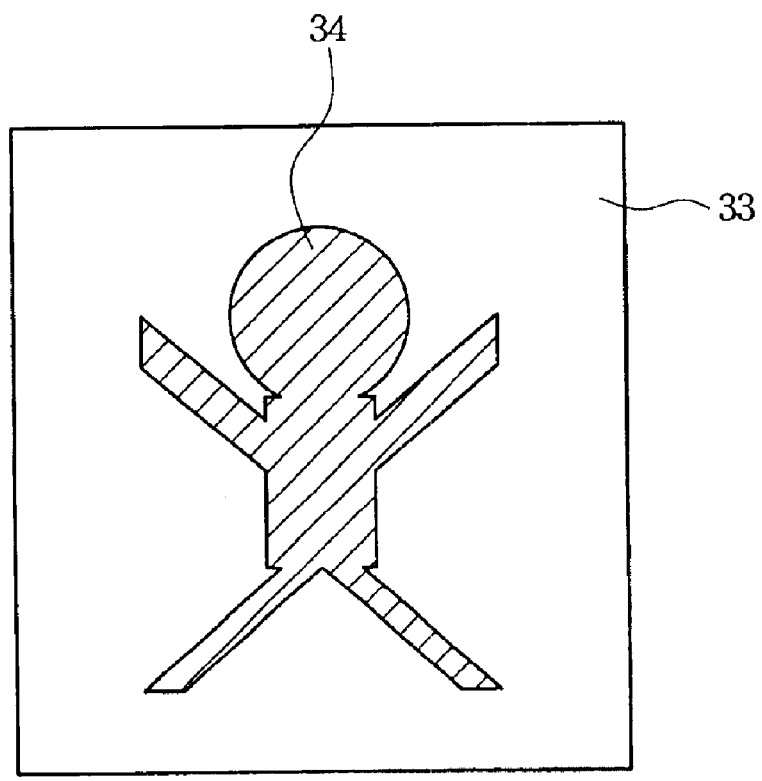
FIG. 2B is a top view of an electron injection layer.
Figure 3A:
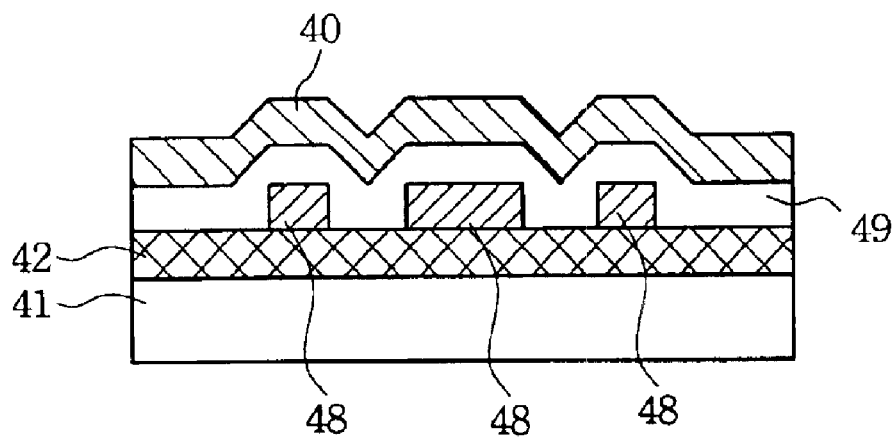
FIG. 3A is a cross-sectional view of a structure of conventional method using the organic EL element to form a pattern on the display panel.
Figure 3B:
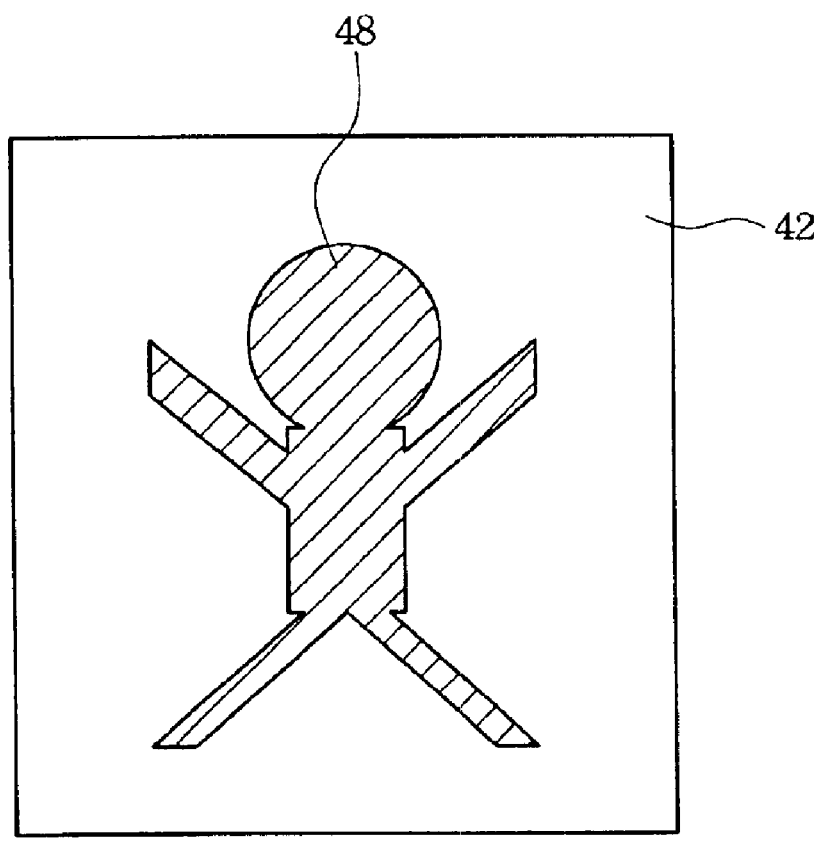
FIG. 3B is a top view of a hole injection layer.
Figure 4A:
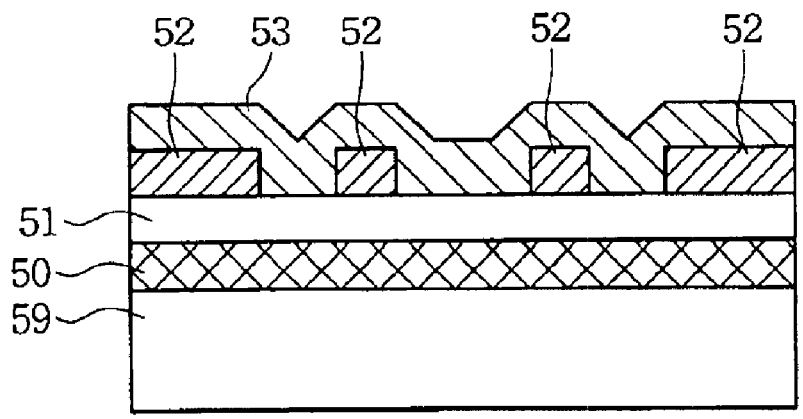
FIG. 4A is a cross-sectional view of a structure of conventional method using the organic EL element to form a pattern on the display panel.
Figure 4B:
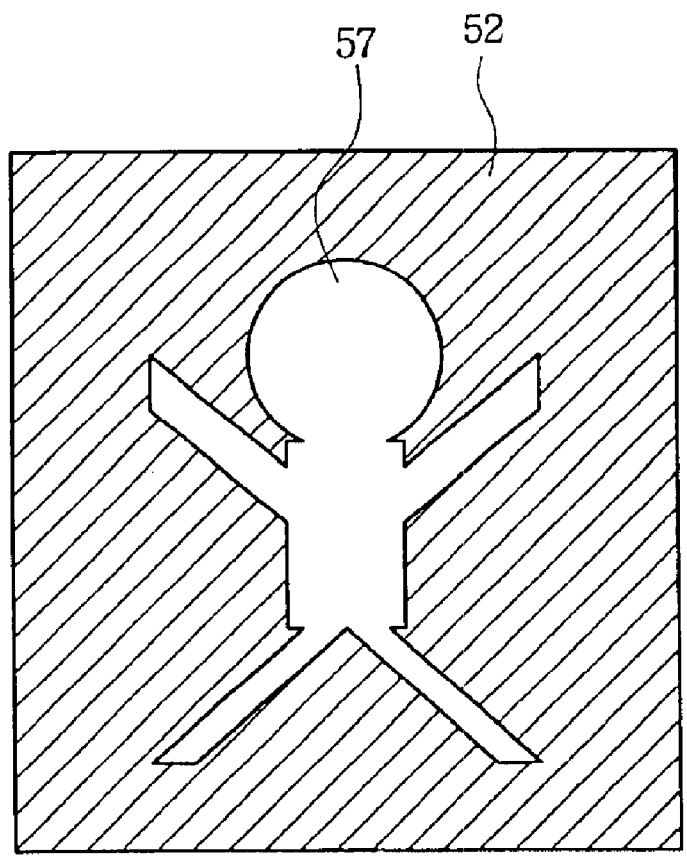
FIG. 4B is a top view of an electron obstruction layer.
Figure 5A:
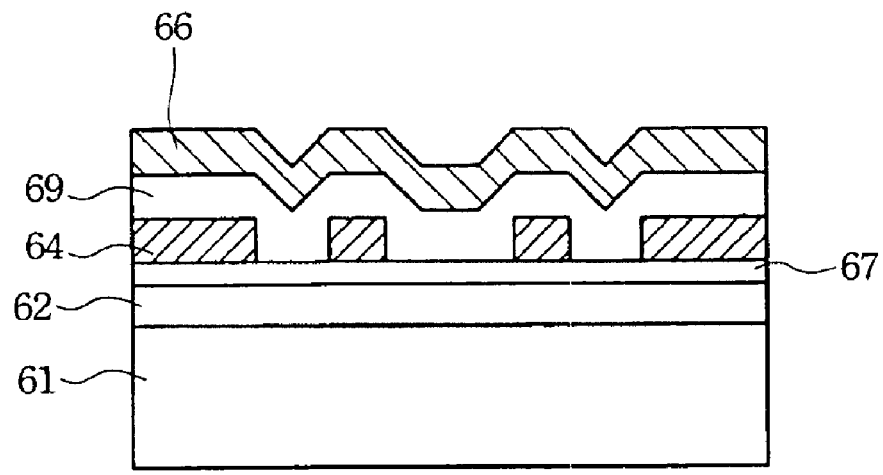
FIG. 5A is a cross-sectional view of a structure of conventional method using the organic EL element to form a pattern on the display panel.
Figure 5B:
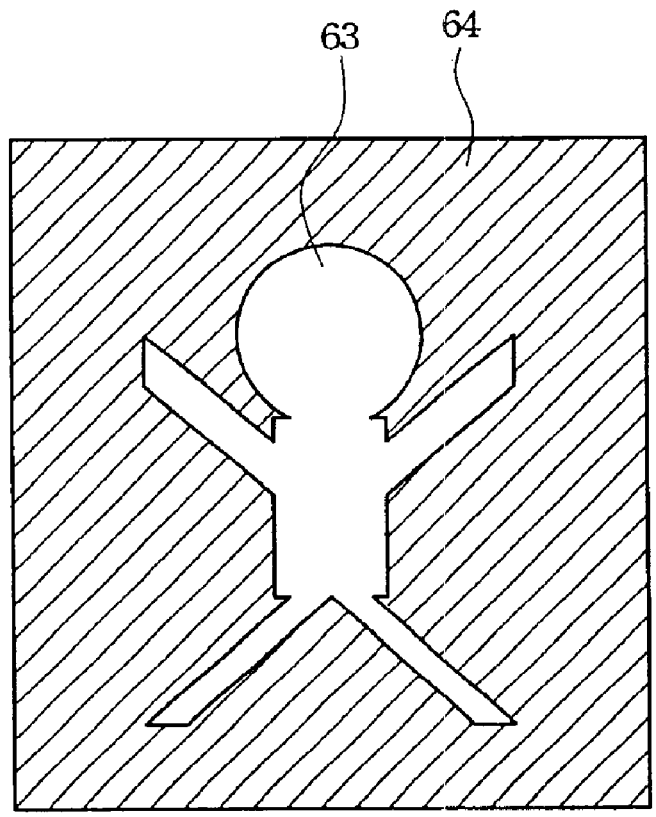
FIG. 5B is a top view of a hole obstruction layer.
Figure 6:
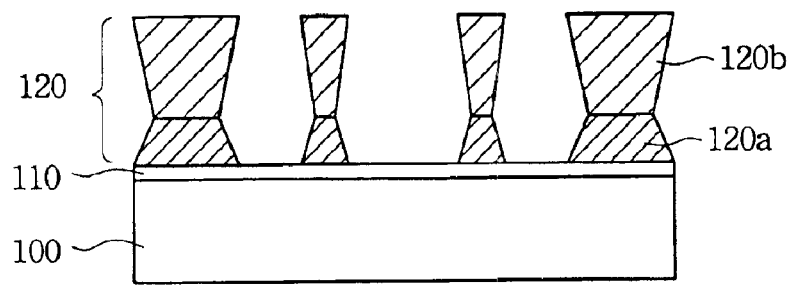
FIG. 6A and FIG. 6B are manufacturing steps and cross-sectional views of a structure of the present invention using the organic EL element to form a pattern on the display panel.
FIG. 6C is a top view of a rampart.
Figure 6:
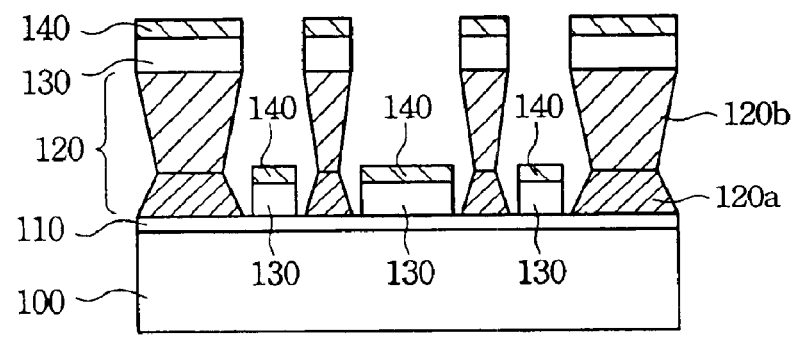
Figure 6:
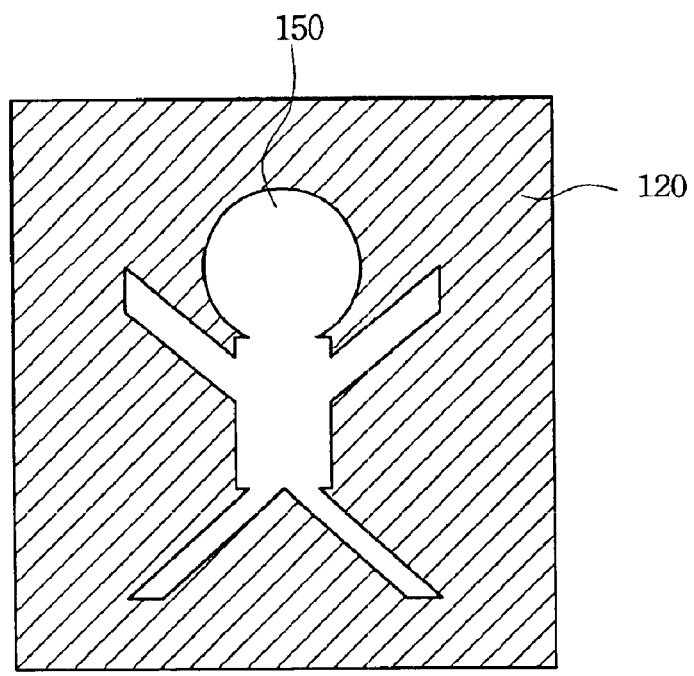

Referring to FIG. 6A and FIG. 6B, showing manufacturing steps and cross-sectional views of the present invention's structure using the organic EL element to form a pattern on the display panel. FIG. 6C is a top view of a rampart.

As shown in FIG. 6A, a substrate 100 is provided containing a first display electrode 110, i.e. an ITO film or other light-transparent conductive substances that have a continuous surface. Thereafter, rampart 120 is formed on the first display electrode 110. As shown in FIG. 6C, an area not covered with a rampart 120 forms a pattern 150 of the icon.

Fundamentally, a rampart 120 as shown in FIG. 6A includes an insulated layer 120a made from polyimide (PI) and a photosensitive insulated layer 120b. The photosensitive insulated layer 120b is a structure of barrel upside and narrow downside, producing a mask effect with sequel evaporation on the organic function layer 130. The insulated layer 120a is used to enhance adhesion between the first display electrode 110 and the photosensitive insulated layer 120b. Considering the photosensitive difference of insulated layer 120a and photosensitive insulated layer 120b, the rampart structure 120 can be formed by only one mask process as shown in FIG. 6A. The manufacturing method and structure of the rampart 120 is not limited in this embodiment, and the rampart may be produced by prior arts. The pattern 150 of the icon formed by a rampart 120, e.g. call-ring, and residual power etc., is not confined to any confined to any specific shape disclosed herein.

As shown in FIG. 6B, an organic function layer 130 and a second display electrode 140 are formed and layered in turn on the exposed portion of the first display electrode 110 and the top surface of the rampart 120. Since the rampart 120 has enough thickness with a structure of barrel upside and narrow downside, the organic function layer 130 forming separately on the exposed first display electrode 110 and on the rampart 120 is divided to the second display electrode 140 due to the shielding of the rampart 120. The first display electrode 110, namely, pattern 150 shown in FIG. 6C, is now exposed by the rampart 120, so that the stacked structure of the organic function layer 130 and the second display electrode 140 located above the first display electrode 110 has the same pattern 150. In the structure, the organic function layer 130 includes a stacked structure of a hole injection layer, a hole transport layer, an emitting layer, an electron transport layer and an electron injection layer. The second display electrode 140 is made of metal material such as aluminum.

With the partition of the rampart 120, an area not covered with rampart 120 forms the organic EL element including the first display electrode 110, the organic layer 130 and the second display electrode 140. In addition, the light emitting area is the same as pattern 150 shown in FIG. 6C. When a specific voltage is applied to the first and second display electrode 110 and 140, only the organic EL element with pattern 150 is luminous through a current. Accordingly, the light-emitting organic EL element will generate a pattern 150 of the icon as shown in FIG. 6C.

Furthermore, since a first display electrode is firstly formed on a substrate in the conventional process of the array type display panel. A rampart is then formed on the first display electrode and the substrate. Finally, an organic function layer and a second display electrode are formed. Accordingly, the process of manufacturing the organic EL element with a pattern of an icon of the present invention is compatible with the conventional process of manufacturing array type display panel.

An advantage of the present invention is to provide a structure and a method of manufacturing organic EL elements. In the present invention, a rampart is used to create a segment between an organic function layer and a second display electrode. To avoid the additional metal mask process on the organic function layer or on the second display electrode for pattern formation, further reduce the cost of evaporation process.

Another advantage of the present invention is to provide a structure and a method of manufacturing an organic EL element. The process of the present invention is compatible with that of the conventional method, so that the disadvantages of complexity, pollution issue, vulnerable pattern control and separate process requirement on the array type display panel and the organic EL element can be resolved.

As is understood by a person skilled in the art, the foregoing preferred embodiments of the present invention are to illustrate the present invention rather than to limit the present invention. It is intended to cover various modifications and similar arrangements accomplished within the spirit and scope of the appended claims, the scope of which should be accorded the broadest interpretation so as to encompass all such modifications and similar structure.

What is claimed is:

1. A method of manufacturing an organic electroluminescent (EL) element to form a pattern on a display panel, comprising:

providing a substrate;

forming a first display electrode having a continuous surface on the substrate;

forming a rampart structure on the continuous surface of the first display electrode for isolating the continuous surface of the first display electrode into a first portion and a second portion, wherein the rampart structure is disposed on the second portion of the first display electrode and the first portion of the continuous surface of the first display electrode is the same as the pattern;

forming at least one organic function layer on the first portion of the first display electrode and the rampart structure; and forming a second display electrode on the organic function layer.

2. The method according to claim 1, wherein the first display electrode is composed of light-transparent conductive material.

3. The method according to claim 1, wherein the first display electrode is made of indium-tin oxide (ITO).

4. The method according to claim 1, wherein the organic function layer further includes an emitting layer.

5. The method according to claim 4, wherein the organic function layer includes a hole injection layer, a hole transport layer, an electron transport and an electron injection layer.

6. The method according to claim 1, wherein the rampart is formed by a one mask process.

7. The method according to claim 1, wherein the second display electrode is metal layer.

8. The method according to claim 1, wherein the second portion of the organic function layer is formed abutted on the rampart structure.

9. The method according to claim 1, wherein the first portion of the organic function layer and the second portion of the organic function layer are formed to be discontinuous.

10. A method of manufacturing an icon structure of an organic electroluminescent (EL) display, comprising:

providing a substrate;

forming a first continuous display electrode, disposed on the substrate;

forming an organic function layer having a first portion with the same pattern with the icon structure, abutted on a first portion of the first continuous display electrode;

forming a rampart structure, located on a second portion of the first continuous display electrode; and forming a second display electrode, located on the organic function layer.

11. The method according to claim 10, wherein the second portion of the organic function layer is formed abutted on the rampart structure.

12. The method according to claim 10, wherein the first portion of the organic function layer and the second portion of the organic function layer are formed to be discontinuous.

* * * * *

UNITED STATES PATENT AND TRADEMARK OFFICE
CERTIFICATE OF CORRECTION

PATENT NO. : 6,860,778 B2  Page 1 of 1
APPLICATION NO. : 10/656099
DATED : March 1, 2005
INVENTOR(S) : Chung et al.

It is certified that error appears in the above-identified patent and that said Letters Patent is hereby corrected as shown below:

<u>Title page,</u>
add Item [73] as follows:

-- [73] Assignee: Chi Mei Optoelectronics Corp.
   Tainan County, Taiwan, R.O.C.--

Signed and Sealed this

Twenty-ninth Day of May, 2007

JON W. DUDAS
*Director of the United States Patent and Trademark Office*